United States Patent
Bae (10) Patent No.: US 10,068,785 B2
(45) Date of Patent: Sep. 4, 2018

(54) WAFER LOADING APPARATUS OF WAFER POLISHING EQUIPMENT AND METHOD FOR ADJUSTING WAFER LOADING POSITION

(71) Applicant: SK Siltron Co., Ltd., Gumi-si, Gyeongsangbuk-do (KR)

(72) Inventor: Jae Hyun Bae, Gumi-si (KR)

(73) Assignee: SK SILTRON CO., LTD., Seoul (KR)

( * ) Notice: Subject to any disclaimer, the term of this patent is extended or adjusted under 35 U.S.C. 154(b) by 0 days.

(21) Appl. No.: 15/527,454

(22) PCT Filed: Jul. 22, 2015

(86) PCT No.: PCT/KR2015/007597
§ 371 (c)(1),
(2) Date: May 17, 2017

(87) PCT Pub. No.: WO2016/080629
PCT Pub. Date: May 26, 2016

(65) Prior Publication Data
US 2017/0323814 A1    Nov. 9, 2017

(30) Foreign Application Priority Data
Nov. 18, 2014  (KR) .......................... 10-2014-0160728

(51) Int. Cl.
*H01L 21/67* (2006.01)
*H01L 21/677* (2006.01)
(Continued)

(52) U.S. Cl.
CPC ........ *H01L 21/67259* (2013.01); *B24B 37/08* (2013.01); *B24B 37/345* (2013.01);
(Continued)

(58) Field of Classification Search
CPC . H01L 21/681; H01L 21/67259; G01D 5/347; G01D 5/34715
See application file for complete search history.

(56) References Cited

U.S. PATENT DOCUMENTS 5,679,055 A * 10/1997 Greene .................. B24B 37/08
                                                    451/10
5,961,169 A * 10/1999 Kalenian ................ B24B 37/30
                                                    269/21
(Continued)

FOREIGN PATENT DOCUMENTS

JP   05-327282    12/1993
JP   2002-521830   7/2002
(Continued)

OTHER PUBLICATIONS

Korean Notice of Allowance dated Mar. 15, 2016 issued in Application No. 10-2014-0160728.
(Continued)

*Primary Examiner* — Thomas Randazzo
(74) *Attorney, Agent, or Firm* — KED & Associates, LLP (57) ABSTRACT

An embodiment relates to a wafer loading apparatus of wafer polishing equipment. Provided is the wafer loading apparatus of wafer polishing equipment, comprising: a wafer polisher that includes a polishing carrier having a wafer hole formed therein in which a wafer is loaded, wherein both sides of the wafer are polished by top and bottom boards; a wafer transferrer that includes a transfer arm disposed above the polishing carrier to transfer the wafer, wherein a transfer plate corresponding to a shape of the wafer is connected to one end the transfer arm; a wafer position detector mounted on a bottom surface of the transfer plate to detect a position of the wafer hole; a plurality of wafer attachment/detachment units formed on an edge portion of the transfer plate; a wafer aligner mounted on a top
(Continued)

surface of the transfer plate to align the wafer; and a controller to which data on the position of the wafer hole, which is detected by the wafer position detector, is transmitted and which calculates a position where the wafer is to be loaded by the wafer attachment/detachment unit and the wafer aligner.

11 Claims, 6 Drawing Sheets

(51) Int. Cl.
  *H01L 21/68*    (2006.01)
  *H01L 21/683*   (2006.01)
  *B24B 37/08*    (2012.01)
  *B24B 37/34*    (2012.01)
  *B24B 49/12*    (2006.01)

(52) U.S. Cl.
  CPC ........ *B24B 49/12* (2013.01); *H01L 21/67742* (2013.01); *H01L 21/681* (2013.01); *H01L 21/6838* (2013.01)

(56) References Cited

U.S. PATENT DOCUMENTS

| | | | | |
|---|---|---|---|---|
| 6,099,596 A * | 8/2000 | Li | ............ | H01L 21/67259 29/25.01 |
| 6,135,854 A * | 10/2000 | Masumura | ............ | B24B 37/08 451/291 |
| 6,196,906 B1 * | 3/2001 | Hakomori | ............ | B24B 37/08 451/339 |
| 6,293,855 B1 * | 9/2001 | Yoshida | ............ | B24B 37/04 451/67 |
| 6,843,704 B2 * | 1/2005 | Potempka | ............ | B24B 37/08 451/261 |
| 2003/0010887 A1 * | 1/2003 | Potempka | ............ | B24B 37/08 248/683 |
| 2005/0048880 A1 * | 3/2005 | Tolles | ............ | B08B 1/007 451/66 |
| 2006/0194406 A1 * | 8/2006 | Ikeda | ............ | H01L 21/681 438/401 |
| 2007/0039827 A1 * | 2/2007 | Wang | ............ | C25D 5/08 205/81 |
| 2008/0056857 A1 * | 3/2008 | Hiroki | ............ | H01L 21/681 414/217.1 |
| 2009/0284760 A1 * | 11/2009 | Chuma | ............ | G01D 5/347 356/614 |
| 2012/0220200 A1 * | 8/2012 | Fukushima | ............ | B24B 37/042 451/60 |
| 2014/0320867 A1 * | 10/2014 | Kanno | ............ | B24B 37/013 356/630 |
| 2016/0189972 A1 * | 6/2016 | Ahn | ............ | H01L 21/30625 438/14 |

FOREIGN PATENT DOCUMENTS

| | | |
|---|---|---|
| JP | 2003-051532 | 2/2003 |
| JP | 2005-286211 | 10/2005 |
| JP | 2006-062801 | 3/2006 |
| JP | 2009-160713 | 7/2009 |
| JP | 4724562 | 7/2011 |
| KR | 10-2001-0072011 | 7/2001 |
| KR | 10-2007-0007613 | 1/2007 |
| KR | 20070007613 A * | 1/2007 ........ H01L 21/681 |
| KR | 10-2011-0031108 | 3/2011 |

OTHER PUBLICATIONS

Japanese Office Action dated Dec. 12, 2017 issued in Application No. 2017-545510.

* cited by examiner

FIG. 9

WAFER LOADING APPARATUS OF WAFER POLISHING EQUIPMENT AND METHOD FOR ADJUSTING WAFER LOADING POSITION

CROSS-REFERENCE TO RELATED PATENT APPLICATIONS

This application is a U.S. National Stage Application under 35 U.S.C. § 371 of PCT Application No. PCT/KR2015/007597, filed Jul. 22, 2015, which claims priority to Korean Patent Application No. 10-2014-0160728, filed Nov. 18, 2014, whose entire disclosures are hereby incorporated by reference.

TECHNICAL FIELD

Embodiments relate to a wafer loading apparatus of wafer polishing equipment and a method of adjusting a wafer loading position, and more particularly, to a wafer loading apparatus of wafer polishing equipment and a method of adjusting a wafer loading position, capable of detecting a loading position of a wafer to load the wafer at a precise position on a polishing carrier and adjusting the position of the wafer to align.

BACKGROUND ART

Generally, a semiconductor device is manufactured by performing various manufacturing processes such as an evaporation process, a photolithographic process, an etching process, an ion-injection process and the like on a silicon wafer.

For example, on a silicon wafer, various processing layers are formed during manufacturing processes. Here, processes of selectively removing or patterning the processing layer in part and depositing an additional processing layer on a surface of a preformed processing layer may be repeatedly performed.

The processing layers may be an insulating layer, an oxide layer, a conductive layer, a metal or glass layer or the like.

In a particular process, an uppermost surface of a processing layer preformed at a wafer may be even for depositing a next processing layer.

Accordingly, a silicon wafer undergoes a polishing process of polishing a preformed processing layer to be even for stably performing a following process. Here, in the polishing process, both sides of a wafer are generally polished using a double side polishing apparatus.

Also, to polish both sides of a wafer to be even, it is important to properly dispose the wafer at a loading position.

Accordingly, Korean Patent Publication No. 10-2005-0066114 discloses a wafer sensing and aligning apparatus including a wafer aligning link installed to guide a side of a wafer, a piston combined with an end of the wafer aligning link to vertically move in a cylinder, a spring disposed between the piston and the cylinder to push a bottom of the piston, a plurality of wafer sensing and aligning units that include a plurality of position sensor installed at a side of the cylinder to sense a vertical position of the piston, are installed at the side of the wafer to sense whether the wafer is mounted at a precise position and aligned, and align the wafer and a method thereof.

However, when a wafer is not horizontally loaded in a wafer hole and tilts, it is impossible to check it and move the wafer to precisely align the wafer at a precise position at which the wafer will be loaded.

DISCLOSURE OF INVENTION

Technical Problem

To solve the above-described problem, it is an aspect to provide a wafer loading apparatus of wafer polishing equipment and a method of adjusting a wafer loading position in which a camera is installed at a wafer transfer arm to detect a position at which a wafer is to be loaded and the position at which the wafer is to be loaded is calculated by using a wafer attachment/detachment unit and a wafer aligner to load the wafer at a precise position at which the wafer is to be loaded.

Technical Solution

One embodiment provides a wafer loading apparatus of wafer polishing equipment, including a wafer polisher that includes a polishing carrier with a wafer hole in which a wafer is loaded and polishes both sides of the wafer using a top board and a bottom board, a wafer transferrer at which a transfer arm disposed at a top of the polishing carrier to transfer the wafer is provided and a transfer plate corresponding to a shape of the wafer is connected to one end of the transfer arm, a wafer position detector installed at a bottom surface of the transfer plate to detect a position of the wafer hole, a plurality of wafer attachment/detachment units formed at an edge of the transfer plate, a wafer aligner installed at a top end surface of the transfer plate to align the wafer, and a controller to which data on the position of the wafer hole detected by the wafer position detector is transmitted and which calculates a position at which the wafer will be loaded by the wafer attachment/detachment units and the wafer aligner.

In the embodiment, the wafer position detector may be provided as a camera, may detect the position of the wafer hole, and may transmit coordinate data of the position of the wafer hole to the controller.

Also, each of the wafer attachment/detachment units may include a vacuum pump that supplies a vacuum, a vacuum tube connected to the vacuum pump, and a vacuum chuck installed at a bottom end of the vacuum tube to attach and detach a top surface of the wafer.

Here, the vacuum tube may include a first tube disposed at a top end of the vacuum chuck to move along a through hole formed at the edge of the transfer plate and a second tube that connects a top end of the first tube to the vacuum pump.

In addition, each of the wafer attachment/detachment units may further include a pressure sensor between the vacuum pump and the second tube, and the pressure sensor may measure a vacuum pressure when the wafer is attached to the vacuum chuck.

Meanwhile, a flange may be formed at a top of the first tube, and an elastic member that surrounds the top of the first tube may be provided between the top end surface of the transfer plate and the flange and may be provided as a spring.

Also, the wafer aligner may include a light emitter provided at the top end surface of the transfer plate to emit light in one direction and a light receiver that receives the light, and a linear scale provided between the light emitter and the light receiver and connected to a top end surface of the flange.

Also, 2n numbers of such wafer attachment/detachment units and wafer aligners may be provided and arranged corresponding to each another.

Another embodiment provides a wafer loading apparatus of wafer polishing equipment, including a wafer polisher that includes a polishing carrier with a wafer hole in which a wafer is loaded and polishes both sides of the wafer using a top board and a bottom board, a wafer transferrer at which a plurality of transfer arms disposed at a top of the polishing carrier to transfer the wafer are longitudinally connected to one another and a transfer plate corresponding to a shape of the wafer is connected to one end of each of the transfer arms, a plurality of wafer position detectors installed at an edge of a bottom surface of the transfer plate to detect a position of each wafer hole, a plurality of wafer attachment/detachment units formed at an edge of the transfer plate, a wafer aligner installed at a top end surface of the transfer plate to align the wafer, and a controller to which data on the position of the wafer hole detected by the wafer position detector is transmitted and which calculates a position at which the wafer will be loaded by the wafer attachment/detachment units and the wafer aligner.

Also, data on the position of the wafer hole detected by the wafer position detector may be transmitted to the controller and a distance by which the wafer will be moved may be calculated in such a way that the wafer may be loaded at a precise position of the wafer hole.

One embodiment provides a method of adjusting a wafer loading position using a wafer loading apparatus of wafer polishing equipment. The method includes (a) an operation of detecting a position of a wafer hole formed in a polishing carrier, (b) a first loading operation of loading a wafer in the wafer hole, (c) an operation of confirming whether the wafer is loaded at a precise position of the wafer hole, (d) an operation of calculating a movement distance of the wafer to load the wafer at the precise position of the wafer hole, and (e) a second loading operation of loading the wafer at the precise position of the wafer hole by adjusting a position of the wafer as much as the movement distance and aligning the wafer.

In the embodiment, in the (a) operation, a wafer position detector may be provided at a wafer transferrer at which a transfer arm disposed at a top of the polishing carrier to transfer the wafer is provided and a transfer plate corresponding to a shape of the wafer is connected to one end of the transfer arm.

Also, in the (a) operation, the wafer position detector may be provided as a camera and installed at a bottom surface of the transfer plate and may detect a position of the wafer hole by capturing an image of the polishing carrier.

Also, in the (b) operation, a top surface of the wafer may be attached to and transferred by a plurality of wafer attachment/detachment units that each include a vacuum pump that supplies a vacuum, a vacuum tube connected to the vacuum pump, and a vacuum chuck installed at a bottom end of the vacuum tube to attach and detach the top surface of the wafer, and are formed at an edge of the transfer plate.

Meanwhile, in the (c) operation, vacuum pressures of 2n number of the vacuum chucks may be measured and when each of the vacuum pressures is a reference value or less, the vacuum pressure may be increased.

Also, in the (d) operation, the wafer may be adjusted in position and may be aligned by a wafer aligner that includes a light emitter provided at a top end surface of the transfer plate to emit light in one direction, a light receiver that receives the light, and a linear scale provided between the light emitter and the light receiver.

In addition, in the (d) operation, data on the position of the wafer hole detected by the wafer position detector may be transmitted to a controller and the controller may calculate a distance by which the wafer will be moved to be loaded at the precise position of the wafer hole.

Also, in the (d) operation, when scale values measured by 2n number of such wafer aligners are not identical, the distance by which the wafer will be moved, that is, a movement distance of the wafer may be calculated. In the (d) operation, a movement distance X of the wafer derived from a diameter Lc of the wafer hole, a diameter Lw of the wafer, a distance Lb between the vacuum chucks, an angle θ formed by a bottom surface of the wafer and the ground ($\theta=\cos^{-1}((L2-L1)/Lb)$), a height Lh calculated by through linear scale ($Lh=Lw/\sin\theta$) and $L=(Lw^2-L1^2)^{(1/2)}=Lw/\cos\theta$ may be calculated as $X=Lc-L$.

Advantageous Effects

According to the above-described embodiment, since a position at which a wafer is to be loaded may be detected by a camera installed at a wafer transfer arm, a precise position at which the wafer is to be loaded may be calculated by a wafer attachment/detachment unit and a wafer aligner, and the wafer may be aligned and loaded at the precise position, top and bottom surfaces of the wafer may be stably polished to be even.

Also, since the wafer is loaded at the precise position and top and bottom surfaces of the wafer are evenly polished, there are effects of notably decreasing a defective rate and increasing productivity in manufacturing wafers.

BEST MODE FOR INVENTION

Hereinafter, preferable embodiments of the present invention for implementing the aspects will be described as follows with reference to the attached drawings.

Figure 1:
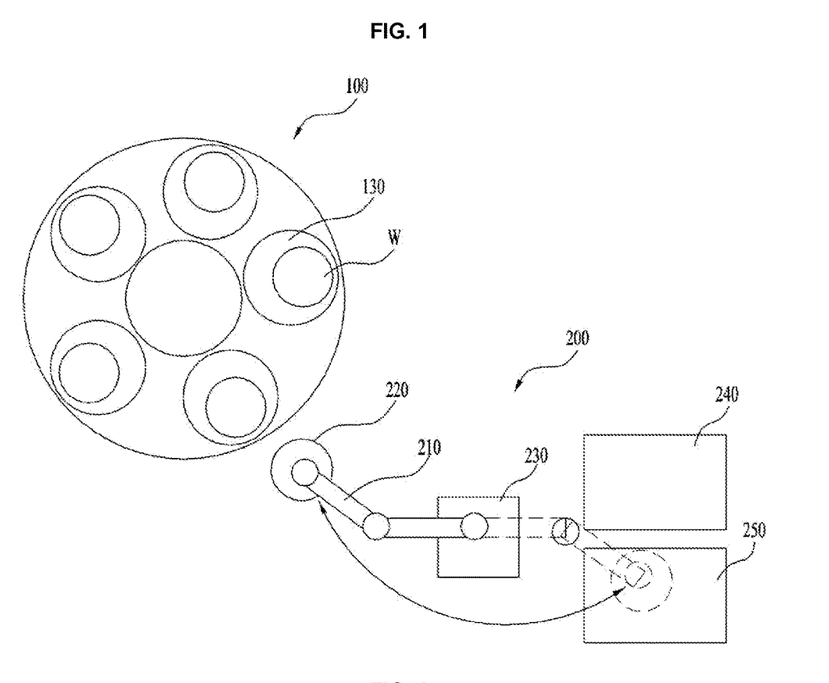
FIG. 1 is a plan view of wafer polishing equipment according to an embodiment.
Figure 2:
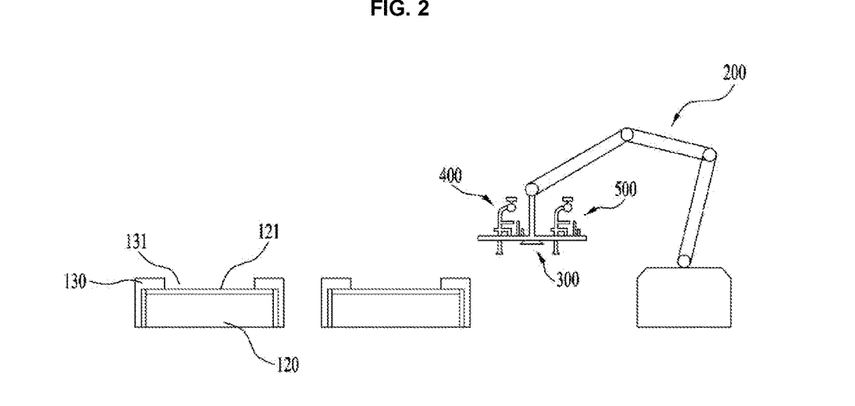
FIG. 2 is a cross-sectional view of the wafer polishing equipment according to the embodiment.
Figure 3:
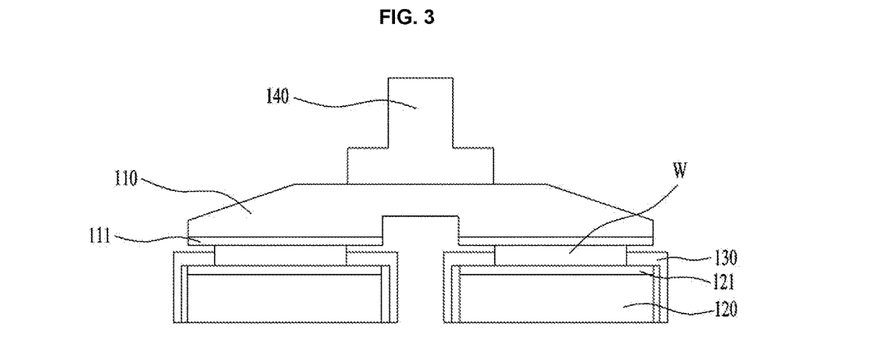
FIG. 3 is a cross-sectional view of a wafer polisher according to the embodiment.

FIG. 1 is a plan view of wafer polishing equipment according to an embodiment, FIG. 2 is a cross-sectional view of the wafer polishing equipment according to the embodiment, and FIG. 3 is a cross-sectional view of a wafer polisher according to the embodiment.

Referring to FIGS. 1 to 3, the wafer polishing equipment according to the embodiment includes a wafer polisher 100, a wafer transferrer 200, a wafer position detector 300, a wafer attachment/detachment unit 400, a wafer aligner 500, and a controller.

Also, a loading stage 240 and an unloading stage 250 capable of storing a wafer to be loaded on the wafer polisher 100 or transferring and storing a polished wafer from the wafer polisher 100 may be further included.

In the embodiment, the wafer polisher 100 includes a polishing carrier 130 at which a wafer hole 131 in which a wafer W is loaded is formed and a top board 110 and a bottom board 120 disposed on top and bottom of the polishing carrier 130 to polish both sides of the wafer W.

Also, a pressurizing cylinder 140 that pressurizes the top board 110 to allow the top board 110 to come into close contact with the wafer W loaded on the polishing carrier 130 when the top board 110 and the bottom board 120 are disposed on the top and bottom of the polishing carrier 130 may be further included.

Here, the polishing carrier 130 is formed in a disk shape and the wafer holes 131 corresponding to shapes and sizes of a plurality of such wafers W are formed at certain intervals along an edge of the polishing carrier 130 to load the wafers W. Also, a top board pad 111 is attached to a bottom surface of the top board 110 and a bottom board pad 121 is attached to a top surface of the bottom board 120. Here, the top board pad 111 and the bottom board pad 121 come into close contact with the both sides of the wafer W while the wafer W is loaded in the wafer hole 131.

Also, the both sides of the wafer W loaded on the polishing carrier 130 are polished by the top board 110 and the bottom board 120 disposed on the top and bottom of the polishing carrier 130.

Here, the wafer W in close contact with the top board pad 111 and the bottom board pad 121 is mechanochemically polished by a frictional force caused by relative motion and slurry formed by mixing polishing particles and various additives.

Meanwhile, there is provided the wafer transferrer 200 that transfers a wafer among the loading stage 240 that stores a wafer to be polished, the unloading stage 250 that transfers and stores a polished wafer, and the wafer polisher 100.

In the embodiment, the wafer transferrer 200 includes a transfer arm 210 disposed above the polishing carrier 130 to transfer a wafer and a transfer plate 220 formed corresponding to a shape of a wafer is connected to and installed at one end of the transfer arm 210.

Also, a driver 230 that supplies driving power to the wafer transferrer 200 is provided.

Meanwhile, a plurality of such transfer arms 210 may be longitudinally connected. In the embodiment, three transfer arms 210 are installed. Here, since each of the plurality of transfer arms 210 may be connected to the driver 230 and may rotate at various angles, the wafer W may be transferred even in a small space regardless of a distance of transferring the wafer W to the wafer polisher 100.

Also, the wafer position detector 300, the wafer attachment/detachment unit 400, and the wafer aligner 500 are installed on the transfer plate 220.

Figure 4:
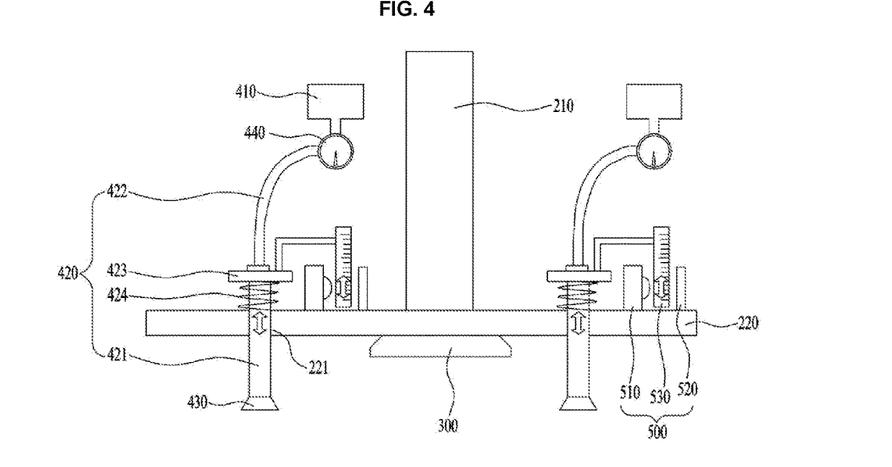
FIG. 4 is a cross-sectional view of a wafer transferrer according to the embodiment.

FIG. 4 is a cross-sectional view of the wafer transferrer according to the embodiment.

Referring to FIG. 4, the wafer position detector 300 is installed at a bottom surface of the transfer plate 220 and may be provided as a camera in the embodiment. Also, when the transfer arm 210 moves to the top of the polishing carrier 130, the camera detects a position of the wafer hole 131 formed in the polishing carrier 130 and transmits coordinate data on the position of the wafer hole on which a wafer will be loaded to the controller that will be described below.

Figure 5:
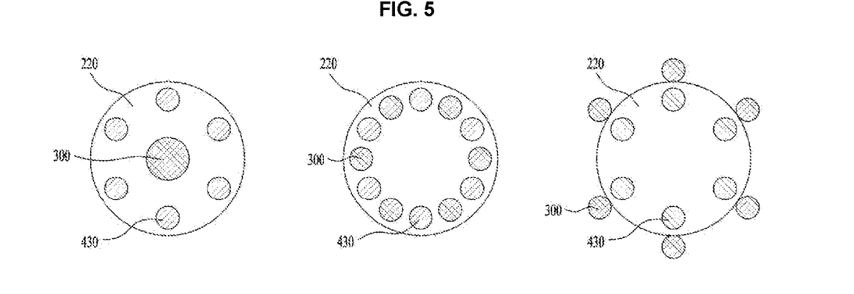
FIG. 5 is a view illustrating examples of a position of a camera installed on a transfer plate according to the embodiment.

FIG. 5 is a view illustrating examples of a position of a camera installed on the transfer plate according to the embodiment.

Referring to FIG. 5, the camera may be installed in a center of a bottom end surface of the transfer plate 220 and may detect positions of a plurality of wafer holes. However, a plurality of such cameras 300 may be installed on an outer circumferential surface or an edge of the bottom end surface of the transfer plate 220 and may be installed in each space between vacuum chucks 430 provided at the transfer plate 220 to correspond to the wafer holes to detect the positions of the wafer holes. Also, the plurality of cameras 300 are installed along the outer circumferential surface of the transfer plate 220 to neighbor on the vacuum chucks 430 provided at the transfer plate 220 to detect the positions of the wafer holes. As described above, the cameras may be installed at various positions on the transfer plate 220 and may detect the positions of the wafer holes.

Also, the transfer arm 210 transfers a wafer stored in the loading stage to the polishing carrier.

Here, the wafer attachment/detachment unit 400 capable of attaching or detaching a wafer is installed at the transfer plate 220. Also, a plurality of such wafer attachment/detachment units 400 may be installed at an edge of the transfer plate 220 to attach and detach an edge of a wafer.

Also, the wafer attachment/detachment unit 400 includes a vacuum pump 410 that supplies a vacuum, a vacuum tube 420 connected to the vacuum pump 410, and the vacuum chuck 430 installed at a bottom end of the vacuum tube 420 to attach and detach a top surface of a wafer.

In addition, the vacuum tube 420 may include a first tube 421 disposed at a top end of the vacuum chuck 430 and a second tube 422 that connects a top end of the first tube 421 and the vacuum pump 410. Here, the first tube 421 is installed along the edge of the transfer plate 220 while passing through a through hole 221 formed in the edge of the transfer plate 220 to correspond to a diameter of the first tube 421 and may vertically move along the through hole 221.

Also, a flange 423 is formed at a top of the first tube 421 that passes through the transfer plate 220 and protrudes above the transfer plate 220. Also, an elastic member may be provided between a top end surface of the transfer plate 220 and the flange 423 to surround the top of the first tube 421. In the embodiment, the elastic member may be provided as a spring 424.

In addition, the wafer attachment/detachment unit 400 may further include a pressure sensor 440 between the vacuum pump 410 and the second tube 422, and the pressure sensor 440 may measure a vacuum pressure when a wafer is attached to the vacuum chuck 430.

Meanwhile, the wafer aligner 500 that aligns wafers to load the wafers on precise positions of wafer holes may be installed on the top end surface of the transfer plate 220.

Also, the wafer aligner 500 includes a light emitter 510 provided at the top end surface of the transfer plate 220 to emit light in one direction, a light receiver 520 that receives the light emitted by the light emitter 510, and a linear scale 530 provided between the light emitter 510 and the light receiver 520 and connected to a top end surface of the flange 423.

Figure 6A:
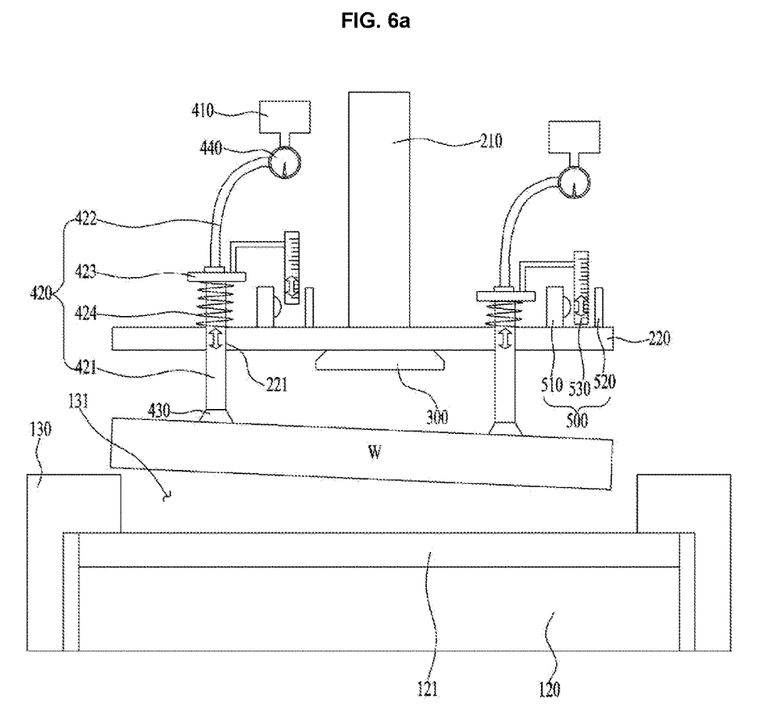
FIGS. 6a and 6b are conceptual views illustrating a process in which a loading position of a wafer is adjusted by a wafer loading apparatus and the wafer is loaded at a precise position of a wafer hole according to the embodiment.
Figure 6B:
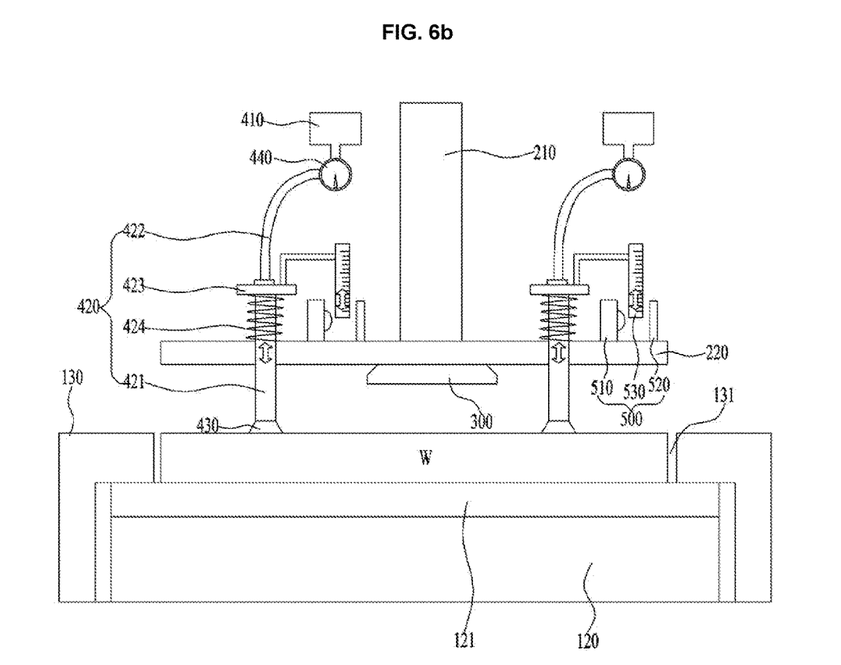

FIGS. 6a and 6b are conceptual views illustrating a process in which a loading position of a wafer is adjusted by a wafer loading apparatus and the wafer is loaded at a precise position of a wafer hole according to the embodiment.

Referring to FIGS. 6a and 6b, when the wafer W is loaded in the wafer hole 131, the wafer W is attached to the vacuum chuck 430. Here, a vacuum pressure applied to the vacuum chuck 430 is measured by the pressure sensor 440.

Also, each scale value of the linear scale 530 installed between the light emitter 510 and the light receiver 520 is measured.

Meanwhile, in the embodiment, a controller (not shown) to which data on the position of the wafer hole 131 detected by the wafer position detector 300 is transmitted and which calculates a position on which the wafer W will be loaded by the wafer attachment/detachment unit 400 and the wafer aligner 500 may be included.

In addition, the data on the position of the wafer hole 131 is transmitted to the controller and the wafer W is transferred to the wafer hole 131. Also, when the vacuum pressure measured by the wafer attachment/detachment unit is measured as a reference value or less, the vacuum pressure is increased by the controller. Also, when the scale value measured by the wafer aligner 500 is transmitted to the controller and a plurality of linear scale values are differently measured, positions on which the wafers W will be loaded are calculated by aligning the wafers W to allow the respective scale values to be identical.

Figure 7:
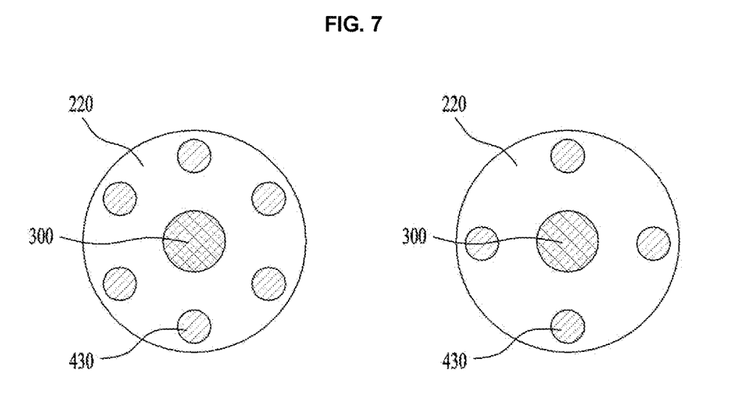
FIG. 7 is a view illustrating examples of a bottom of the transfer plate at which vacuum chucks are installed according to the embodiment.

FIG. 7 is a view illustrating examples of a bottom of the transfer plate at which vacuum chucks are installed according to the embodiment.

As shown in FIG. 7, to calculate the position on which the wafer W will be loaded, 2n numbers of such wafer attachment/detachment units and wafer aligners are necessary.

Accordingly, in the embodiment, 2n numbers of such wafer attachment/detachment units and wafer aligners may be provided around the wafer position detector 300 and may be arranged corresponding to each other at the edge of the transfer plate 220 as shown in FIG. 7.

According to the above-described embodiment, since a position on which a wafer will be loaded is detected by the camera installed at the wafer transfer arm, a precise position on which the wafer will be loaded is calculated by the wafer attachment/detachment unit and the wafer aligner, and the wafer is aligned and loaded at the precise position, top and bottom surfaces of the wafer may be stably polished to be even.

In addition, a method of adjusting a loading position of a wafer using the wafer loading apparatus of wafer polishing equipment according to the embodiment will be described as follows.

The method of adjusting the wafer loading position using the wafer loading apparatus of wafer polishing equipment according to the embodiment includes (a) an operation 10 of detecting a position of a wafer hole formed in a polishing carrier, (b) a first loading operation 20 of loading a wafer in the wafer hole, (c) an operation 30 of confirming whether the wafer is loaded at a precise position of the wafer hole, (d) an operation 40 of calculating a movement distance of the wafer to load the wafer at the precise position of the wafer hole, and (e) a second loading operation 50 of loading the wafer at the precise position of the wafer hole by adjusting a position of the wafer as much as the movement distance and aligning the wafer.

Figure 8:
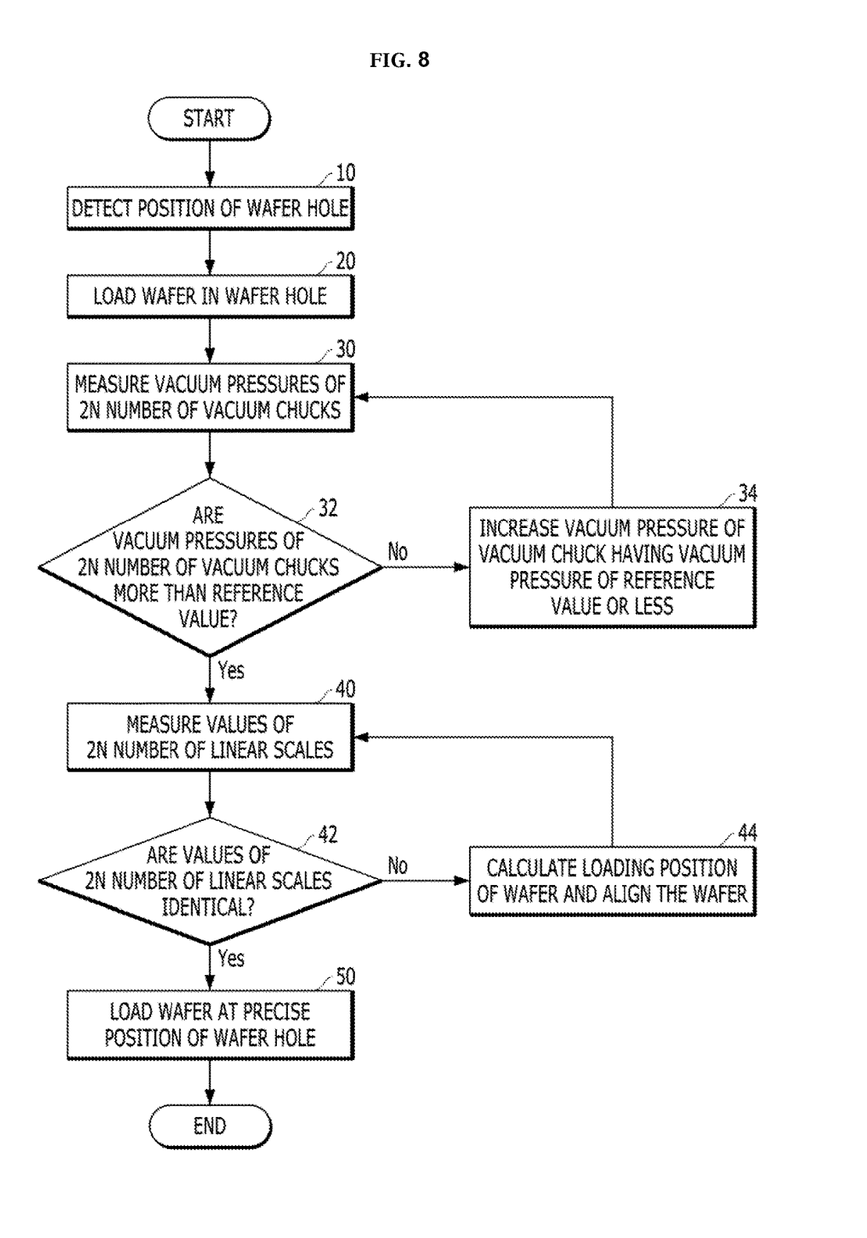
FIG. 8 is a flowchart illustrating a method of adjusting a wafer loading position according to the embodiment.

FIG. 8 is a flowchart illustrating the method of adjusting a wafer loading position according to the embodiment.

Referring to FIG. 8, in the operation 10 of detecting the position of the wafer hole formed in the polishing carrier, a wafer position detector that detects the position of the wafer hole is provided. Here, the wafer position detector may be installed at a transfer plate connected to one end of a transfer arm disposed at a top of the polishing carrier to transfer a wafer.

Also, the transfer plate is formed corresponding to a shape of a wafer and the wafer position detector may be installed in a center of a bottom end surface of the transfer plate to detect the wafer hole when the transfer plate is positioned above the polishing carrier.

Also, in the operation 10 of detecting the position of the wafer hole formed in the polishing carrier, the wafer position detector may be provided as a camera to detect the position of the wafer hole by capturing an image of the polishing carrier.

Also, in the first loading operation 20 of loading the wafer in the wafer hole, the wafer is attached to and transferred by a wafer attachment/detachment unit to the wafer hole. Here, a plurality of such wafer attachment/detachment units may be formed at an edge of the transfer plate and may transfer the wafer to the wafer hole while being attached to a top surface of the wafer.

When the wafer is transferred to the wafer hole, in the operation 30 of confirming whether the wafer is loaded at the precise position of the wafer hole, it is confirmed whether the wafer is attached to the wafer attachment/detachment unit at a vacuum pressure of a reference value.

Here, the wafer attachment/detachment unit includes a vacuum pump that supplies a vacuum, a vacuum tube connected to the vacuum pump, and a vacuum chuck installed at a bottom end of the vacuum tube to be attached to or detached from a top surface of a wafer. Here, the vacuum tube may include a first tube disposed at a top end of the vacuum chuck and a second tube that connects a top end of the first tube and the vacuum pump. Also, the first tube is installed along the edge of the transfer plate while passing through a through hole formed in the edge of the transfer plate to correspond to a diameter of the first tube and may vertically move along the through hole.

Also, a flange is formed at a top of the first tube that passes through the transfer plate and protrudes above the transfer plate. Also, an elastic member may be provided between a top end surface of the transfer plate and the flange to surround the top of the first tube. In the embodiment, the elastic member may be provided as a spring.

In addition, the wafer attachment/detachment unit may further include a pressure sensor between the vacuum pump and the second tube and the pressure sensor measures a vacuum pressure when a wafer is attached to the vacuum chuck. Also, vacuum pressures of 2n number of such vacuum chucks are measured and when each of the vacuum pressures is a reference value or less, the vacuum pressure is increased.

Afterwards, in the operation 40 of calculating the movement distance of the wafer to load the wafer at the precise position of the wafer hole, a light emitter that emits light in one direction and a light receiver that receives light are installed at the top end surface of the transfer plate and the movement distance of the wafer may be calculated by a wafer aligner including a linear scale between the light emitter and the light receiver.

In other words, the linear scale is connected to a top end surface of the flange of the first tube and when the wafer is loaded, a linear scale value thereof is measured.

In addition, in the operation 40 of calculating the movement distance of the wafer to load the wafer at the precise position of the wafer hole, data on a position of the wafer hole detected by the wafer position detector is transmitted to a controller, a measured vacuum pressure value is transmitted from the wafer attachment/detachment unit, and each linear scale value measured is transmitted from the wafer aligner.

In more detail, the wafer position detector is provided as a camera in the embodiment. A position of a wafer hole formed in the polishing carrier is detected by a camera, coordinate data on the position of the wafer hole in which the wafer will be loaded is transmitted to the controller, and the wafer transferrer transfers the wafer to the wafer hole.

Also, the controller confirms whether the wafer is loaded in the wafer hole by measuring a vacuum pressure at each vacuum chuck of the wafer attachment/detachment unit and comparing the measured vacuum pressure with a reference value of the vacuum pressure. When the vacuum pressure is measured to be smaller than the reference value, it is determined that the wafer is not adequately loaded in the wafer hole and the vacuum pressure of the vacuum chuck is increased.

In addition, the controller calculates a distance by which the wafer will be moved to be loaded at the precise position of the wafer hole and determines that the wafer is not horizontally loaded in the wafer hole when a plurality of such linear scale values measured by the wafer aligner are different. Accordingly, the wafer is loaded at the precise position of the wafer hole by moving the transfer arm until each of the linear scale values is identically measured.

Also, in the operation 40 of calculating the movement distance of the wafer to load the wafer at the precise position of the wafer hole, an equation that calculates a movement distance for loading a wafer at a precise position of a wafer hole may be derived from a diameter of the wafer hole, a diameter of the wafer, a distance between vacuum chucks and the like.

Figure 9:
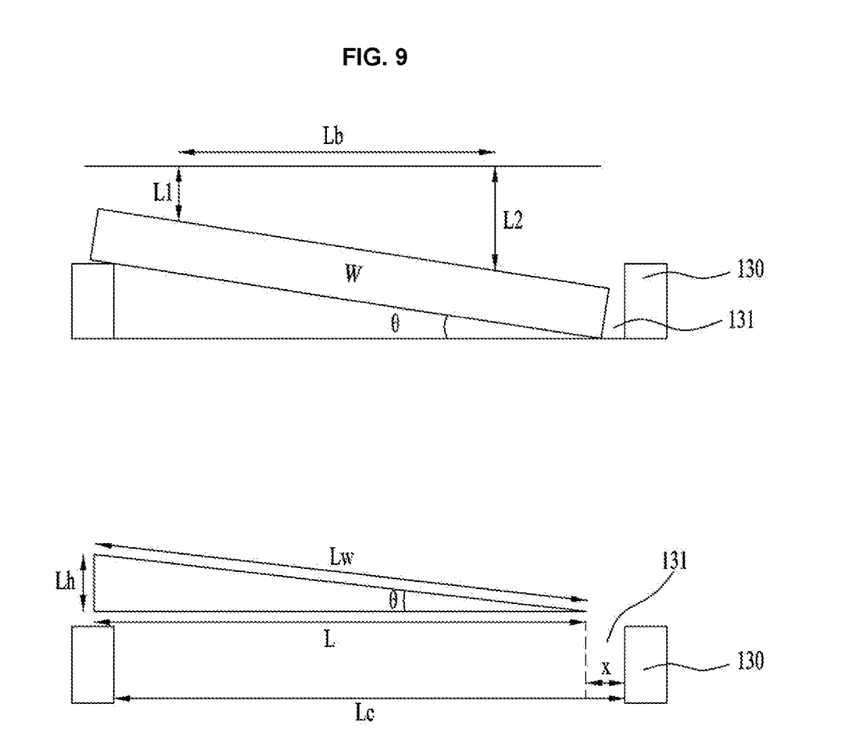
FIG. 9 is a conceptual view illustrating a process of calculating a movement distance of a wafer by the wafer loading apparatus according to the embodiment.

FIG. 9 is a conceptual view illustrating a process of calculating a movement distance of a wafer by the wafer loading apparatus according to the embodiment.

Referring to FIG. 9, an equation that calculates the movement distance in the operation 40 of calculating the movement distance of the wafer to load the wafer at the precise position of the wafer hole is as follows.

The movement distance X of the wafer is calculated as $X=Lc-L$ and may be derived from a diameter Lc of the wafer hole, a diameter Lw of the wafer, a distance Lb between the vacuum chucks, an angle θ formed by a bottom surface of the wafer and the ground ($\theta = \cos^{-1}((L2-L1)/Lb)$), a height Lh calculated through the linear scale ($Lh = Lw/\sin\theta$) and $L = (Lw^2 - L1^2)^{(1/2)} = Lw/\cos\theta$.

To calculate the above-described movement distance, 2n numbers of such wafer attachment/detachment units and wafer aligners may be provided and arranged corresponding to each another at the edge of the transfer plate.

Also, in the second loading operation 50, the position of the wafer may be adjusted as much as the movement distance and the wafer may be aligned to be loaded at the precise position of the wafer hole. Accordingly, since the wafer is loaded at the precise position and top and bottom surfaces of the wafer are evenly polished, there are effects of notably decreasing a defective rate and increasing productivity in manufacturing wafers.

Although the embodiment has been described above, it is merely an example and not intended to limit the present invention and it should be appreciated that various modifications and applications not described above may be made by one of ordinary skill in the art without departing from the essential features of the embodiment. For example, each of components described in detail in the embodiment may be implemented in a modifiable manner. Also, differences related to such modifications and applications should be understood as being included in the scope of the present invention defined by the attached claims.

MODE FOR INVENTION

A mode for implementing the invention has been adequately described in "best mode for invention".

INDUSTRIAL APPLICABILITY

The above-described wafer loading apparatus of wafer polishing equipment is industrially applicable to various fields. For example, the wafer loading apparatus of wafer polishing equipment is applicable to a wafer-double-side polishing apparatus used in post-processing of a wafer for a process of polishing both sides of a wafer to be level.

The invention claimed is:

1. A wafer loading apparatus of wafer polishing equipment, comprising:
   a wafer polisher that includes a polishing carrier with a wafer hole in which a wafer is loaded, the wafer polisher configured to polish both sides of the wafer using a top board and a bottom board;
   a wafer transferrer provided adjacent to the wafer polisher that includes a transfer arm disposed at a top of the polishing carrier and configured to transfer the wafer, and a transfer plate corresponding to a shape of the wafer connected to a first end of the transfer arm;
   a wafer position detector installed at a bottom surface of the transfer plate and configured to detect a position of the wafer hole;
   a plurality of wafer attachment/detachment units formed at an edge of the transfer plate;
   a wafer aligner installed at a top end surface of the transfer plate to align the wafer; and
   a controller to which data on the position of the wafer hole detected by the wafer position detector is transmitted and is configured to calculate a position at which the wafer will be loaded by the wafer attachment/detachment units and the wafer aligner, wherein each of the wafer attachment/detachment units comprises a vacuum pump that generates a vacuum, a vacuum tube connected to the vacuum pump, and a vacuum chuck installed at a bottom end of the vacuum tube to attach to and detach from a top surface of the wafer,
   wherein the vacuum tube comprises a first tube provided at a top end of the vacuum chuck and arranged to pass through a through hole formed at the edge of the transfer plate, a second tube that connects a top end of the first tube to the vacuum pump, and a flange formed at the top end of the first tube, and
   wherein the wafer aligner comprises a light emitter provided at the top end surface of the transfer plate and configured to emit light in one direction, a light receiver that receives the light, and a linear scale provided between the light emitter and the light receiver and connected to a top end surface of the flange and separated from the light emitter and the light receiver.

2. The wafer loading apparatus of claim 1, wherein the wafer position detector is provided as a camera, detects the position of the wafer hole and transmits coordinate data of the position of the wafer hole to the controller.

3. The wafer loading apparatus of claim 1, wherein each of the wafer attachment/detachment units further comprises a pressure sensor between the vacuum pump and the second tube, and the pressure sensor measures a vacuum pressure when the wafer is attached to the vacuum chuck.

4. The wafer loading apparatus of claim 1, wherein an elastic member that surrounds the top of the first tube is provided between the top end surface of the transfer plate and the flange.

5. The wafer loading apparatus of claim 1, wherein even numbers of such wafer attachment/detachment units and wafer aligners are provided and arranged corresponding to each other.

6. A method of adjusting a wafer loading position using a wafer loading apparatus of wafer polishing equipment, the method comprising:
(a) an operation of detecting a position of a wafer hole formed in a polishing carrier;
(b) a first loading operation of loading a wafer in the wafer hole;
(c) an operation of confirming whether the wafer is loaded at a precise position of the wafer hole;
(d) an operation of calculating a movement distance of the wafer to load the wafer at the precise position of the wafer hole; and
(e) a second loading operation of loading the wafer at the precise position of the wafer hole by adjusting a position of the wafer as much as the movement distance and aligning the wafer, wherein in the (a) operation, a wafer position detector is provided at a wafer transferrer at which a transfer arm disposed at a top of the polishing carrier to transfer the wafer is provided and a transfer plate corresponding to a shape of the wafer is connected to one end of the transfer arm,
wherein in the (b) operation, a top surface of the wafer is attached to and transferred by a plurality of wafer attachment/detachment units that each comprise a vacuum pump that supplies a vacuum, a vacuum tube connected to the vacuum pump, a flange formed at a top of the vacuum tube, and a vacuum chuck installed at a bottom end of the vacuum tube to attach and detach the top surface of the wafer, and are formed at an edge of the transfer plate, and wherein in the (d) operation, the wafer is adjusted in position and is aligned by a wafer aligner that comprises a light emitter provided at a top end surface of the transfer plate to emit light in one direction and a light receiver that receives the light, and a linear scale provided between the light emitter and the light receiver and connected to a top end surface of the flange and separated from the light emitter and the light receiver.

7. The method of claim 6, wherein in the (a) operation, the wafer position detector is provided as a camera and installed at a bottom surface of the transfer plate and detects a position of the wafer hole by capturing an image of the polishing carrier.

8. The method according to claim 6, wherein in the (c) operation, vacuum pressures of even number of such vacuum chucks are measured and when each of the vacuum pressures is a reference value or less, the vacuum pressure is increased.

9. The method of claim 6, wherein in the (d) operation, data on the position of the wafer hole detected by the wafer position detector is transmitted to a controller and the controller calculates a distance by which the wafer will be moved to be loaded at the precise position of the wafer hole.

10. The method of claim 9, wherein in the (d) operation, when scale values measured by even number of such wafer aligners are not identical, the distance by which the wafer will be moved, that is, a movement distance of the wafer is calculated.

11. The method according to claim 6, wherein in the (d) operation, a movement distance X of the wafer derived from a diameter $Lc$ of the wafer hole, a diameter $Lw$ of the wafer, a distance $Lb$ between the vacuum chucks, an angle $\theta$ formed by a bottom surface of the wafer and the ground ($\theta=\cos-1((L2-L1)/Lb)$), a height $Lh$ calculated through the linear scale ($Lh=Lw/\sin\theta$) and $L=(Lw2-L12)(½)=Lw/\cos\theta$ is calculated as $X=Lc-L$.

* * * * *